United States Patent
Yew et al.

[11] Patent Number: 6,159,845
[45] Date of Patent: Dec. 12, 2000

[54] METHOD FOR MANUFACTURING DIELECTRIC LAYER

[75] Inventors: Tri-Rung Yew, Hsinchu Hsien; Water Lur, Taipei; Hsien-Ta Chung, Hsinchu, all of Taiwan

[73] Assignees: United Microelectronics Corp.; United Silicon Incorporated, both of Hsinchu, Taiwan

[21] Appl. No.: 09/395,906

[22] Filed: Sep. 11, 1999

[51] Int. Cl.[7] .............................................. H01L 21/4763
[52] U.S. Cl. .................... 438/637; 438/619; 438/624; 438/638; 438/687
[58] Field of Search .................... 438/620, 624, 438/619, 687, 637, 639, 702, 636

[56] References Cited

U.S. PATENT DOCUMENTS

| | | | |
|---|---|---|---|
| 5,641,712 | 6/1997 | Grivna | 438/624 |
| 5,837,618 | 11/1998 | Avanzino | 438/778 |
| 5,872,064 | 2/1999 | Huff | 438/778 |
| 5,949,143 | 9/1999 | Bang | 257/758 |

*Primary Examiner*—Charles Bowers
*Assistant Examiner*—Erik Kielin
*Attorney, Agent, or Firm*—Charles C. H. Wu; Charles C. H. Wu & Associates

[57] ABSTRACT

A dielectric layer in a dual-damascene interconnect is described. A dual-damascene interconnect structure is formed on a substrate. The dual-damascene interconnect structure has a first dielectric layer formed over the substrate, a second dielectric layer formed on the first dielectric layer, a first wire penetrating through the second dielectric layer and a second wire. The second wire penetrates through the second dielectric layer and is electrically coupled to the substrate. The second dielectric layer is removed. A barrier cap layer is formed conformally over the substrate. A third dielectric layer is formed on the barrier cap layer and an air gap is formed in a space enclosed by the third dielectric layer, the first and the second wires. A fourth dielectric layer is formed on the third dielectric layer. A planarizing process is performed to planarize the fourth dielectric layer.

14 Claims, 3 Drawing Sheets

METHOD FOR MANUFACTURING DIELECTRIC LAYER

BACKGROUND OF THE INVENTION

1. Field of Invention

The present invention relates to a method for manufacturing a dielectric layer. More particularly, the present invention relates to a method for manufacturing a dielectric layer with a relatively low dielectric constant in a dual-damascene interconnect structure.

2. Description of Related Art

In the process for manufacturing an ultra large-scale integrated circuit, over one hundred thousand of transistors are located a silicon substrate with an area of about 1–2 square centimeters. Additionally, in order to increase the integration of the integrated circuits (ICs), the density of wires used to electrically couple the transistors to each other or the other devices to each other is increased. Therefore, in accord with the increased interconnect manufacturing requirements of miniaturized MOS transistors, it is increasingly necessary for IC manufacturing to adopt a design with more than two metal layers. Taking a logic circuit as an example, there are six metal layers in the current integrated circuit.

However, due to the increasingly high integration of ICs, the distance between the adjacent wires is decreased. If the dielectric constant of the IMD layer used as an electrically isolated material between the wires cannot be effectively decreased, unnecessary capacitive and inductive coupling between the adjacent conductive wires occurs. Hence, the RC time delay is increased caused by the capacitive and inductive coupling between the adjacent conductive wires. Moreover, the rate of data transmission between the devices is decreased due to the increasing of the RC time delay. Hence, the ability of the devices is limited.

Typically, in the dual damascene process, the inter-metal dielectric layer and the intra-metal dielectric layer are made of a dielectric material with a relatively low dielectric constant, such as fluorosilicate glass (FSG), to decrease the RC time delay between the metal layers and between the wires. However, the dielectric constant of fluorosilicate glass is about 3.5, only 15% lower than that of oxide (k=4.1), so that the reduction of RC time delay is limited. Furthermore, in the requirement for the dielectric layer with a dielectric constant lower than 3, the other dielectric material with a low dielectric constant including organic and inorganic dielectric material are still not mature for production. Therefore, organic dielectric material and inorganic dielectric material are seldom used in the integrated circuit.

SUMMARY OF THE INVENTION

The invention provides a method of manufacturing a dielectric layer in a dual-damascene interconnect. A substrate is provided. A dual-damascene interconnect structure is formed on the substrate. The dual-damascene interconnect structure has a first dielectric layer formed over the substrate, a second dielectric layer formed on the first dielectric layer, a first wire penetrating through the second dielectric layer and a second wire. The second wire penetrates through the second dielectric layer and is electrically coupled to the substrate. The second dielectric layer is removed. A barrier cap layer is formed conformally over the substrate. A third dielectric layer is formed on the barrier cap layer and an air gap is formed in a space enclosed by the third dielectric layer, the first and the second wires. A fourth dielectric layer is formed on the third dielectric layer. A planarizing process is performed to planarize the fourth dielectric layer.

As embodied and broadly described herein, the third dielectric layer possess a relatively poor step coverage and the third dielectric layer is formed from inorganic dielectric material by plasma-enhanced chemical vapor deposition. Since the dielectric constant of the air gap is about 1.0, the capacitive and inductive coupling and the RC time delay between the first and the second wires can be effectively decreased. Moreover, the interference noise between the first and the second wires can be greatly decreased. Furthermore, the dielectric constant between the multilevel metal interconnects is decreased, so that the RC time delay and the interference noise between the multilevel metal interconnects are decreased. Additionally, the rate of data transmission and the ability of the devices are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional views of the process for manufacturing a dielectric layer in a dual-damascene interconnect in a preferred embodiment according to the invention.

Figure 1A:
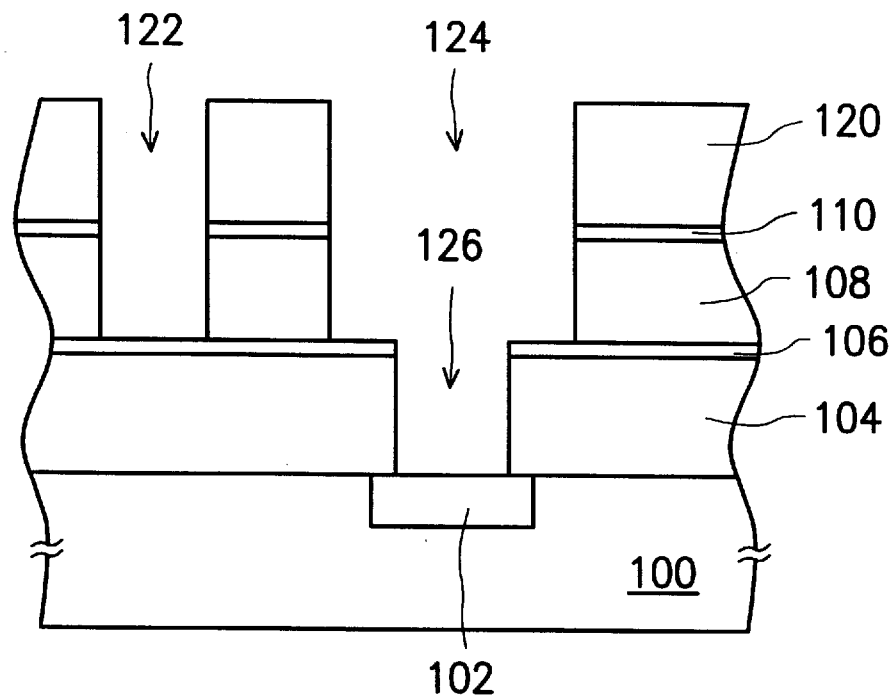
FIGS. 1A through 1E are schematic, cross-sectional views of the process for manufacturing a dielectric layer in a dual-damascene interconnect in a preferred embodiment according to the invention.

As shown in FIG. 1A, a substrate 100 having a wire 102 and semiconductor devices (not shown) formed therein is provided. A dielectric layer 104 is formed on the substrate 100. The dielectric layer 104 can be formed from organic dielectric material by spin coating or from silicon-oxy-fluoride, porous silicon oxide or inorganic dielectric material by chemical vapor deposition (CVD), for example.

An etching stop layer 106 is formed on the dielectric layer 104. The etching rate of the etching stop layer 106 is different from that of the dielectric layer 104. The etching stop layer 106 can be formed from silicon-oxy-nitride, silicon nitride, silicon carbon or silicon oxide by CVD, for example. The etching stop layer 106 is patterned to form an opening (not shown) exposing a portion of the dielectric layer 104 above the wire 102.

A dielectric layer 108 with a relatively low dielectric constant is formed on the etching stop layer 106 and the exposed dielectric layer 104. The etching rate of the dielectric layer 108 is different from that of the etching stop layer 106. The dielectric layer 108 can be made of organic dielectric material, for example. Preferably, the organic dielectric material comprises FLARE (fluorinated poly (arylene etherd)) produced by Allied Signals, BCB (benzocyclobutane), amorphous carbon or SILK produced by Dow Chemical and the method of forming the organic dielectric material layer can be spin coating, for example.

A hard mask layer 110 is formed on the dielectric layer 108. The hard mask layer 110 can be formed from silicon-oxy nitride, silicon oxide or silicon nitride by CVD, for example. A patterned photoresist 120 is formed on the hard mask layer 110 to expose a portion of the hard mask layer 110. Trenches 122 and 124 are formed in the hard mask layer 110 and the dielectric layer 108. Simultaneously, a via hole 126 is formed in the etching stop layer 106 and the dielectric layer 104 to expose a portion of the wire 102. The via hole 126 communicates with the bottom of the trench 124. The method of forming the trenches 122 and 124 comprises the step of removing a portion of the hard mask layer 110 and dielectric layer 108 until a portion of the etching stop layer 106 is exposed. Furthermore, the method of forming the via hole 126 comprises the step of removing a portion of the dielectric layer 104 exposed by the opening formed in the etching stop layer 106 until a portion of the wire 102 is exposed.

Figure 1B:
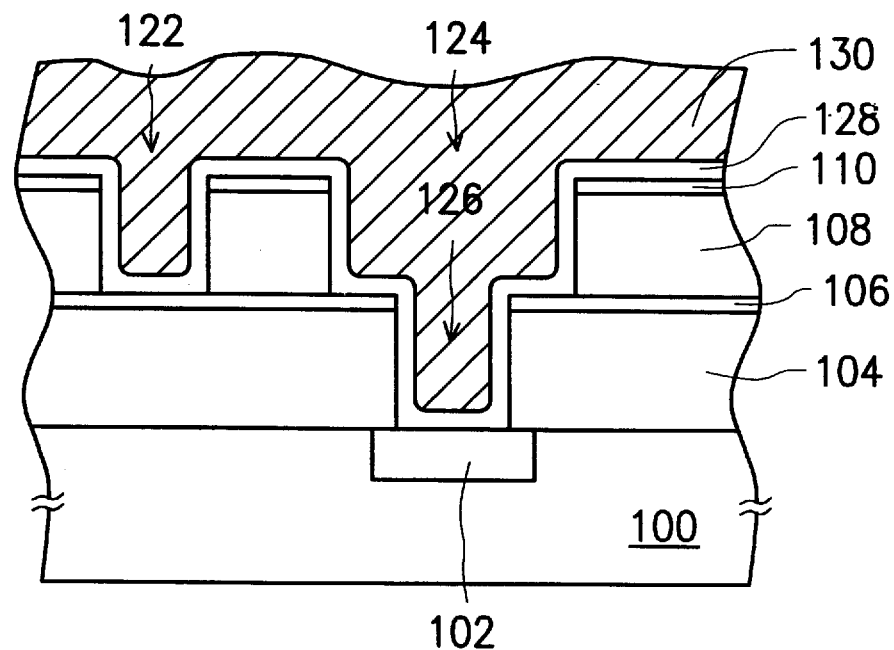

As shown in FIG. 1B, the patterned photoresist 120 (FIG. 1A) is removed. A barrier layer 128 is conformally formed over the substrate 100. The barrier layer 128 can be formed of tantalum nitride, tantalum, tungsten nitride or titanium nitride, for example. The barrier layer 128 is used to protect the dielectric layers 108 and 104 from the diffusion of the conductive material formed subsequently in the trenches 122 and 124 and the via hole 126. Therefore, the electric problem of the devices due to the diffusion of the conductive material can be avoided. Moreover, the adhesion between the conductive material formed subsequently and the dielectric layers 104 and 106 can be increased. A conductive layer 130 is formed on the barrier layer 128 and fills the trenches 122 and 124 and the via hole 126. The conductive layer 130 can be made of copper or copper alloy, for example.

Figure 1C:
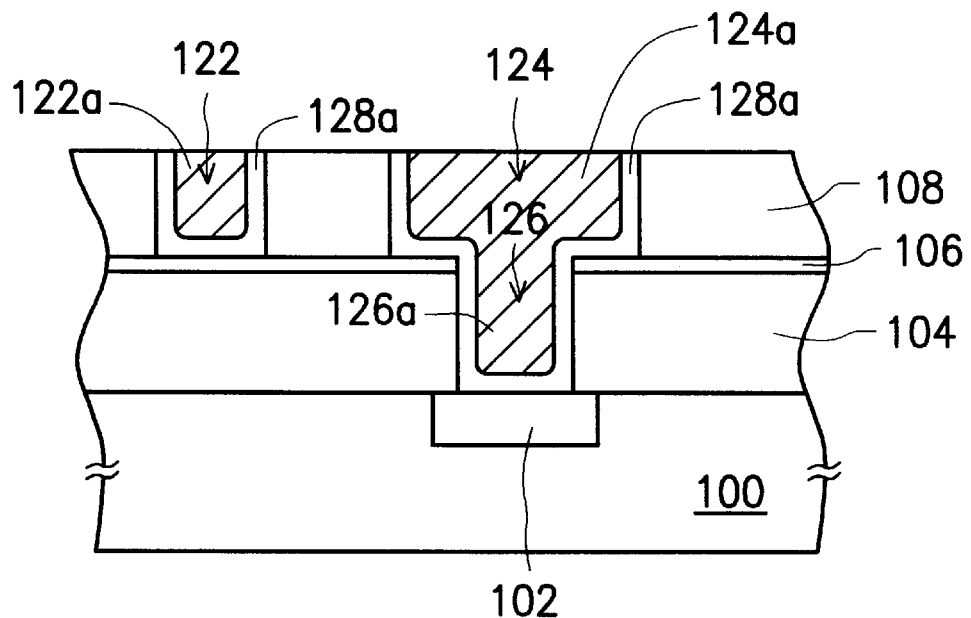

As shown in FIG. 1C, a portion of the conductive layer 130, barrier layer 128 and hard mask layer 110 are removed to form wires 122a and 124a and via plug 126a, respectively, in the trenches 122 and 124 and via hole 126 until the surface of the dielectric layer 108 is exposed. After that, the process for manufacturing the dual-damascene interconnect structure is finished. The remaining barrier layer 128 is denoted as a barrier layer 128a. The wire 124a is electrically coupled to the wire 102 through the via plug 126a. The method of removing the portion of the conductive layer 130, barrier layer 128 and hard mask layer 110 can be chemical-mechanical polishing (CMP), for example.

Since the hard mask layer 110 protects the dielectric layer 108 from the diffusion of the metal material particles, such as copper particles, produced while the portion of the conductive layer 130 is removed, problems of leakage and shorts caused by the diffusion of the metal material particles can be avoided.

Figure 1D:
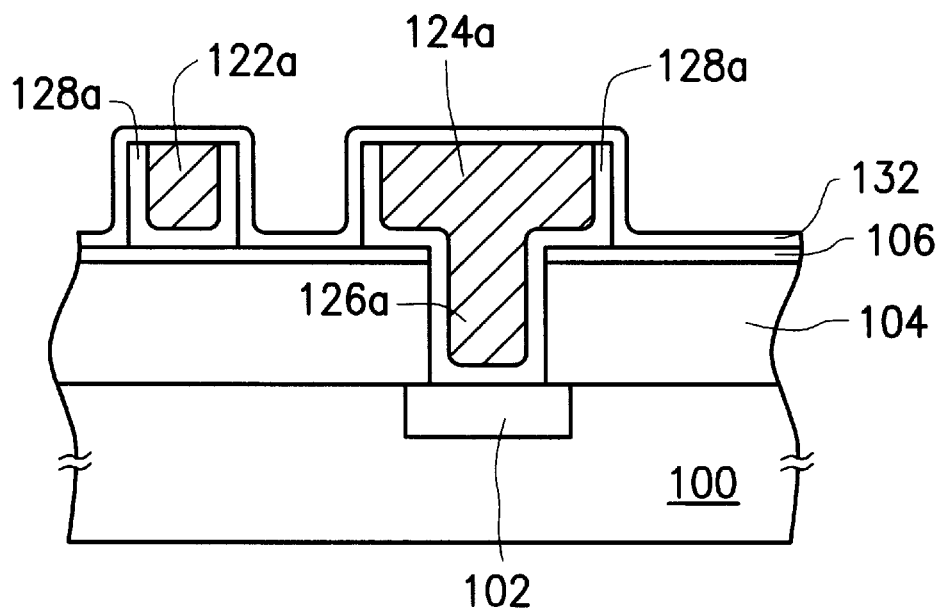

As shown in FIG. 1D, the dielectric layer 108 (FIG. 1C) is removed until the barrier layer 128a is completely exposed. The dielectric layer 108 can be removed by solvent or dry etching, for example. A barrier cap layer 132 is conformally formed on the etching stop layer 106, wires 122a and 124a and barrier layer 128a. The barrier cap layer 132 can be made of silicon nitride, silicon carbide or silicon-oxy-nitride, for example.

Figure 1E:
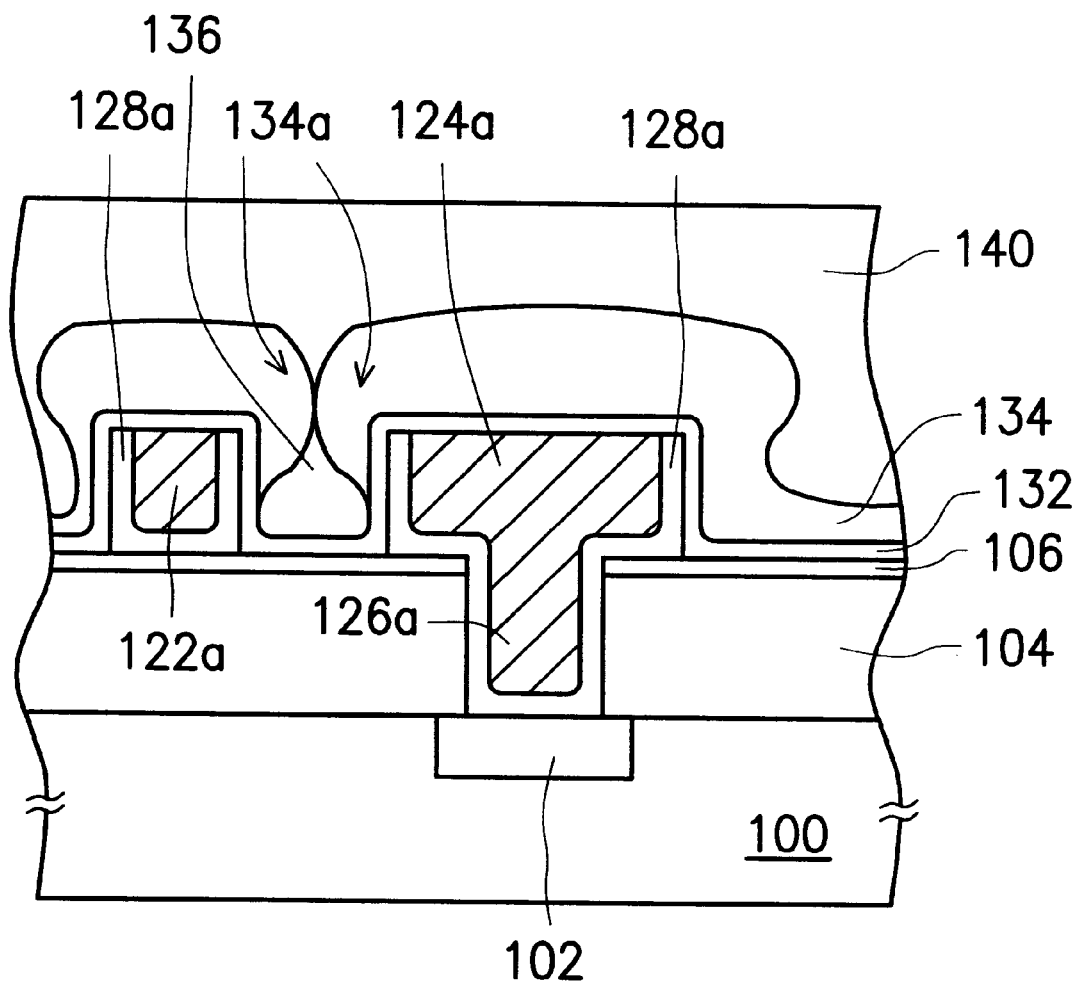

As shown in FIG. 1E, a dielectric layer 134 with a relatively low dielectric constant is formed on the barrier cap layer 132 and an air gap is formed in a space between the dielectric layer 134 and the wires 122a and 124a. The dielectric layer 134 is a dielectric layer with a relatively poor step coverage. The dielectric layer 134 can be formed from inorganic dielectric material by plasma-enhanced chemical vapor deposition (PECVD), for example. Preferably, the inorganic dielectric material can be fluorosilicate glass, black diamond produced by Applied Materials or Coral produced by Novellus.

When the dielectric layer 134 with a relatively poor step coverage is formed on the barrier cap layer and fills the space between the wires 122a and 124a, overhang structures 134a are formed on the upper corner of the wires 122a and 124a. Because of the formation of the overhang structures 134a, it is difficult to fill the space between the wires 122a and 124a with the material of the dielectric layer 134 and the overhang structures 134a grow with the formation of the dielectric layer 134 until the overhang structures 134a are in contact with each other. In this manner, the air gap 136 is formed in the space between the wires 122a and 124a and under the dielectric layer 134.

Since the air gap 136 possesses a dielectric constant that is about 1.0 lower than that of the silicon oxide, the dielectric constant between the wires 122a and 124a can be greatly decreased. Incidentally, the RC time delay between the multilevel metal interconnects can be decreased, as well.

A planar dielectric layer 140 is formed on the dielectric layer 134. The dielectric layer 140 can be made of inorganic dielectric material, for example. Preferably, the inorganic dielectric material can be fluorosilicate glass or black diamond. The method for planarizing the dielectric layer 140 can be CMP, for example. Another series of processes for manufacturing the dual-damascene structure (not shown) is performed to finish the multilevel metal interconnects process.

In the preferable embodiment according to the invention, the procedure used to form a dual-damascene interconnect structure is one kind of dual-damascene technique. People skilled in the art may accomplish the invention by incorporating the invention with other proper dual-damascene technique.

In the invention, the dielectric material between the wires is removed after the dual-damascene interconnect structure is formed. Then, a dielectric layer with a relatively poor step coverage is formed to cover the space between the wires and to form an air gap in the space. Since the dielectric constant of the air gap is about 1.0, the capacitive and inductive coupling and the RC time delay between the wires can be effectively decreased. Moreover, the interference noise between the wires can be greatly decreased. Furthermore, the dielectric constant between the multilevel metal interconnects is decreased, so that the RC time delay and the interference noise between the multilevel metal interconnects are decreased. Additionally, the rate of data transmission and the ability of the devices are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dielectric layer in a dual-damascene interconnect, comprising the steps of:
   providing a substrate;
   forming a dual-damascene interconnect structure on the substrate, wherein the dual-damascene interconnect structure has a first dielectric layer formed over the substrate, a second dielectric layer formed on the first dielectric layer, a first wire penetrating through the second dielectric layer and a second wire, the second wire penetrates through the second dielectric layer and is electrically coupled to the substrate;

removing the second dielectric layer;

forming a barrier cap layer conformally over the substrate;

forming a third dielectric layer on the barrier cap layer, wherein a air gap is formed in a space enclosed by the second dielectric layer, the first and the second wires;

forming a fourth dielectric layer on the second dielectric layer; and performing a planarizing process to planarize the third dielectric layer.

2. The method of claim 1, wherein the third dielectric layer possess a relatively poor step coverage.

3. The method of claim 1, wherein the third dielectric layer is formed from inorganic dielectric material by plasma-enhanced chemical vapor deposition.

4. The method of claim 1, wherein the first dielectric layer is formed from organic dielectric material by spin coating.

5. The method of claim 1, wherein the first and the second wires are made of copper.

6. The method of claim 1, wherein the first and the second wires are made of copper alloy.

7. A method of manufacturing a dielectric layer in a dual-damascene interconnect, comprising the steps of:

providing a substrate;

forming a first dielectric layer and an organic dielectric material layer over the substrate in sequence, wherein the first dielectric layer has a via hole formed therein, the organic dielectric material has a first and a second trenches formed therein and the via hole communicates with the first trench;

forming a barrier layer conformally over the substrate;

forming a conductive layer on the barrier layer to fill the first and the second trenches and the via hole;

removing a portion of the conductive layer and the barrier layer until a surface of the organic dielectric material layer is exposed to form a first and a second wire and a via plug, respectively, in the first and the second trenches and the via hole;

removing the organic dielectric material layer;

forming a barrier cap layer conformally over the substrate;

forming an inorganic dielectric material layer on the barrier cap layer, wherein a air gap is formed in a space enclosed by the inorganic dielectric material layer, the first and the second wires;

forming a second dielectric layer on the inorganic dielectric material layer; and performing a planarizing process to planarize the second dielectric layer.

8. The method of claim 7, wherein the inorganic dielectric material layer is formed by plasma-enhanced chemical vapor deposition.

9. The method of claim 7, wherein the organic dielectric material is formed by spin coating.

10. The method of claim 7, wherein the conductive layer is made of copper.

11. The method of claim 7, wherein the conductive layer is made of copper alloy.

12. The method of claim 7, wherein the barrier cap layer is made of silicon nitride.

13. The method of claim 7, wherein the barrier cap layer is made of silicon-oxy-nitride.

14. The method of claim 7, wherein the barrier cap layer is made of silicon carbide.

* * * * *